United States Patent [19]
Kikuchi

[11] Patent Number: 5,717,483
[45] Date of Patent: Feb. 10, 1998

[54] ILLUMINATION OPTICAL APPARATUS AND METHOD AND EXPOSURE APPARATUS USING THE ILLUMINATION OPTICAL APPARATUS AND METHOD

[75] Inventor: Tetsuo Kikuchi, Tokyo, Japan

[73] Assignee: Nikon Corporation, Japan

[21] Appl. No.: 364,575

[22] Filed: Dec. 27, 1994

[30] Foreign Application Priority Data

Dec. 27, 1993 [JP] Japan .................. 5-331190

[51] Int. Cl.$^6$ .................................. G03B 27/72
[52] U.S. Cl. .................................. 355/69
[58] Field of Search .................. 355/53, 67, 68, 355/69

[56] References Cited

U.S. PATENT DOCUMENTS

| | | | |
|---|---|---|---|
| 5,097,291 | 3/1992 | Suzuki | 355/69 |
| 5,329,336 | 7/1994 | Hirano et al. | 355/53 |

FOREIGN PATENT DOCUMENTS

| | | |
|---|---|---|
| 57-62052A | 4/1982 | Japan . |
| 59-155843A | 9/1984 | Japan . |
| 4-225358A | 8/1992 | Japan . |
| 6-132191A | 5/1994 | Japan . |

*Primary Examiner*—Fred L. Braun
*Attorney, Agent, or Firm*—Pennie & Edmonds LLP

[57] ABSTRACT

An illumination optical apparatus for setting the illuminance on an illuminated object as high as possible at or below the upper limit of illuminance. When the illumination state changing unit changes the illumination state of illumination light, for example, when the numerical aperture is decreased to lower the illuminance on the illuminated object, the power supplied to the light source is increased; inversely, when the numerical aperture is increased to enhance the illuminance on the illuminated object, the power supplied to the light source is decreased so that the illuminance is kept at or below the predetermined upper limit. This can maintain the illuminance on the illuminated object high and nearly constant even with a change of the illumination state.

26 Claims, 7 Drawing Sheets

ILLUMINATION OPTICAL APPARATUS AND METHOD AND EXPOSURE APPARATUS USING THE ILLUMINATION OPTICAL APPARATUS AND METHOD

BACKGROUND OF THE INVENTION

1. Field of the Invention

The present invention relates to an illumination optical apparatus suitably applicable to an illumination system in exposure apparatus, for example, used in the photolithography process for fabricating semiconductor elements, etc., and also to the exposure apparatus.

2. Related Background Art

Exposure apparatus used in fabricating semiconductor elements or liquid crystal display elements, etc. normally have functions to illuminate a photomask as called as a reticle or mask on which a predetermined pattern is formed, with illumination light (exposure light) of uniform illuminance and to transfer the pattern on the photomask onto a wafer (or glass plate, etc.) coated with a photoresist. It is thus important for the exposure apparatus to supply illumination light having high luminance and wavelength characteristics coincident with photosensitive characteristics of the photoresist. Then short arc (super-high pressure) mercury lamps (Hg lamp, Xe—Hg lamp, etc.) are employed as the exposure light source.

An exposure apparatus having such a short arc (super-high pressure) mercury lamp as the exposure light source is normally provided with an illumination optical system which has an input lens for nearly collimating illumination light from the mercury lamp, an optical integrator for forming a number of light source images from the nearly collimated light, an illumination system aperture stop (hereinafter referred to as "σ stop") for selecting a predetermined region within the many light source images, and a condenser lens for nearly collimating light passing through the σ stop to illuminate a reticle.

In this case, the shape of aperture in the σ stop determines the coherency factor (so-called σ value) of the illumination light. For example, illumination of σ=0 is coherent illumination, illumination of 0<σ<1 partial coherent illumination, and illumination of σ=1 incoherent illumination. Accordingly, choosing the σ value, the resolution of the pattern of reticle exposed on a wafer, and the depth of focus can be arbitrarily set.

Normally, there is provided one fixed σ stop for determining the illumination conditions. However, recently developed is a mechanism to enable exchange of σ stops with various aperture shapes, for example as disclosed in Japanese Laid-open Patent Application No. 59-155843, in order to comply with various conditions such as the resolution of pattern or the depth of focus necessary in exposure step.

Incidentally, the short arc (super-high pressure) mercury lamp as described has the life, and it is known that relative intensity of light output gradually decreases with constant input power.

Figure 1:
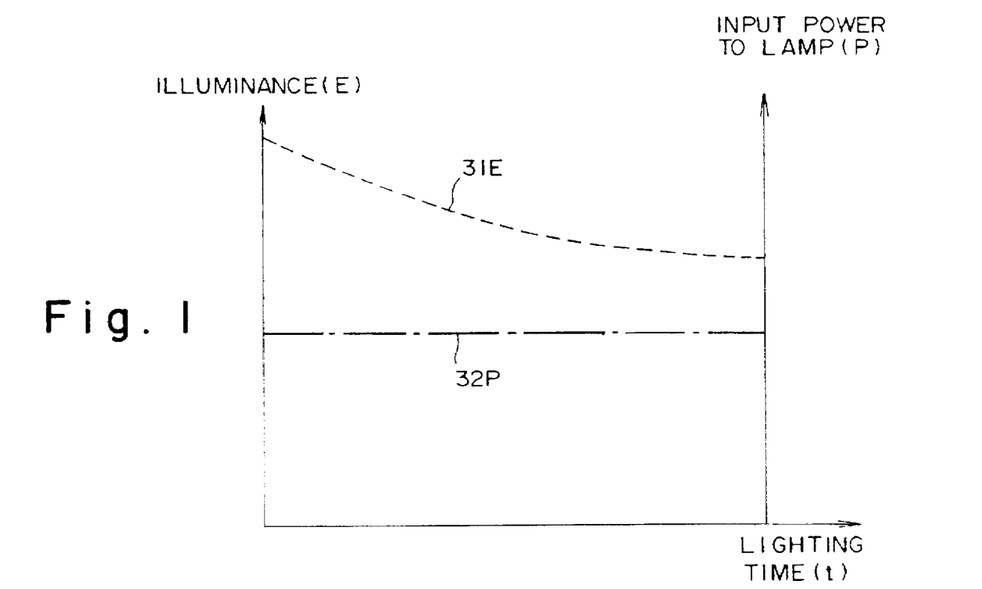
FIG. 1 is a drawing to show a conventional example of relation between input power to lamp and illuminance.

FIG. 1 shows a relation of illuminants on wafer versus integral value of emission time of mercury lamp (hereinafter referred to as "lighting time") where the input power to the mercury lamp is kept constant. In FIG. 1, the horizontal axis represents the lighting time t while the vertical axis the illuminants E on wafer and the input power P to the mercury lamp. Further, a straight line 32P indicates a relation between lighting time t and input power P, and a curve 31E a relation between lighting time t and illuminance E. In the following figures, lines and curves accompanied with character E (for example, 31E) indicate the illuminants E, while lines and curves accompanied with character P (for example, 32P) correspond to the input power P. As shown in FIG. 1, it is known that while the input power P is kept constant as shorn by the-straight line 32P, the illuminance E on wafer attenuates as shown by the curve 31E, gradually decreasing the relative intensity. The attenuation of light output is caused by a small amount of scattering objects attached to the internal wall of a bulb of the mercury lamp with a lapse of lighting time to decrease an effective radiation amount. The manner of attenuation is determined by abrasion of the electrodes, accumulation of thermal strain, etc.

SUMMARY OF THE INVENTION

The present invention has been accomplished in view of the above points, and an object of the invention is to enable to set the illuminance on an illuminated object as high as possible at or below the upper limit of illuminance even if the light output of the light source drops as described or even if the illumination conditions such as the shape or the size of σ stop are changed.

The above object and other objects will be further apparent from the following description.

Provided according to the present invention is an illumination optical apparatus comprising a light source, an illumination optical system for illuminating an illuminated object at a nearly uniform illuminance with illumination light emitted from the light source, illumination state changing means for changing an illumination state on the illuminated object with the illumination light, and power controlling means for controlling power supplied to the light source.

Also provided according to the present invention is an exposure apparatus comprising a light source, parallel beam forming means for converting light from the light source into light having nearly parallel beams, multi-beam generating optical element for forming a plurality of secondary light source images, based on the light emerging from the parallel beam forming means, a condenser lens for illuminating an illuminated object in a superimposed manner with light from the multi-beam generating optical element, illumination state changing means for changing an illumination state on the illuminated object with the illumination light, power controlling means for controlling power supplied to the light source, a reticle stage for carrying a reticle as the illuminated object and positioning it, a projection optical system for projecting light from the reticle, and a substrate stage for carrying a substrate coated with a photoresist onto which a pattern of the reticle is transferred with the light from the protection optical system, and positioning the substrate, wherein a position of the substrate is made conjugate with a position of the reticle by the projection optical system.

According to the present invention, when the illumination state changing means changes the illumination state of illumination light (the numerical aperture or the like), for example, when the numerical aperture is decreased no lower the illuminance on the illuminated object, the power supplied to the light source 1 is increased; inversely, when the numerical aperture is increased to enhance the illuminance on the illuminated object, the power supplied to the light source 1 is decreased so that the illuminance is kept at or below the predetermined upper limit, for example. This can maintain the luminance on the illuminated object high and nearly constant even with a change of the illumination state.

Figure 5:
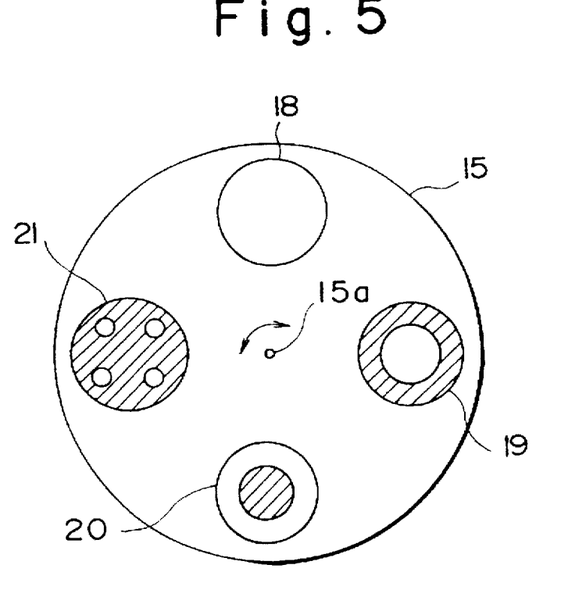
FIG. 5 is an enlarged drawing to show four stops provided in a variable σ stop 15 in FIG. 4.

If the illumination state changing means is variable aperture stop means, for example, having a plurality of aperture stops 18 to 21 as shown in FIG. 5, changeover of the aperture stops 18 to 21 also changes the illuminance on the illuminated object because of differences in area of aperture portion. Then, for example, the reference is taken an an illuminance when the aperture stop 21 with the minimum area of aperture is used and the illuminance on the illuminated object takes a maximum value at or below the predetermined upper limit. The illuminance in using the other aperture stops 18 to 20 is arranged to match with the reference. This can maintain the illuminance on the illuminated object high and nearly constant even with exchange of the aperture stops 18 to 21.

In order to apply the illumination optical apparatus of the present invention, for example, to a projection exposure apparatus, allowable power is set for the input power to the light source 1 as well as the upper limit of illuminance to the illuminated object 9. In this case, the power controlling means 17 needs to control the power supplied to the light source 1 in such a manner that the input power to the light source 1 is at or below the allowable power and that the illuminance of illumination light on the illuminated object 9 never exceeds the predetermined upper limit. This can extend the life of the light source 1.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

An embodiment of the illumination optical apparatus according to the present invention will be described referring to FIG. 2 to FIG. 10.

As described previously, if an exposure apparatus uses an illumination optical system having a light source of mercury lamp, the light output of illumination light of a certain constant wavelength attenuates with a lapse of time so as to decrease the illuminance on a wafer. Thus, integral exposure energy of illumination light impinging upon the wafer can be made constant by setting the printing time longer in accordance with the lighting time of mercury lamp.

Figure 2:
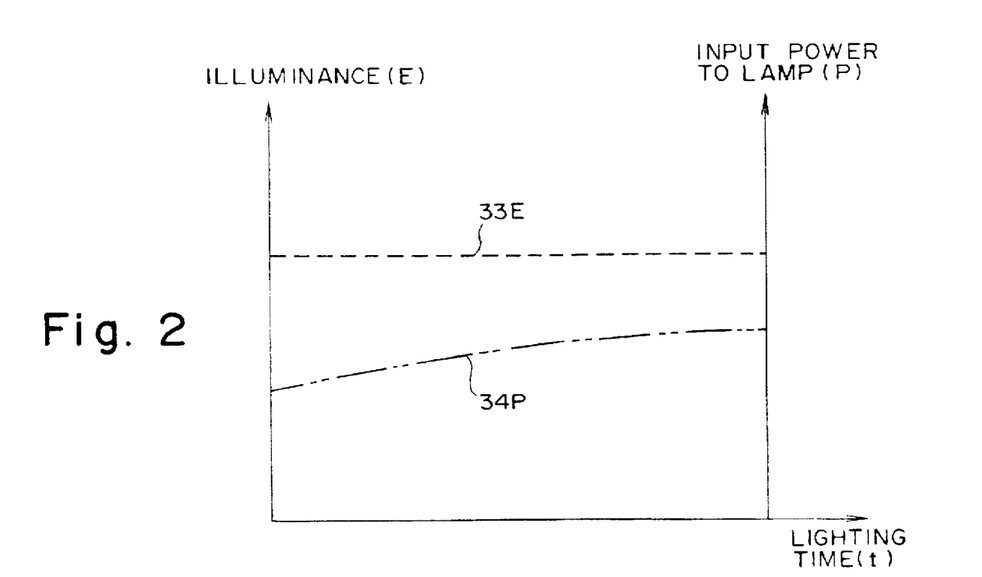
FIG. 2 is a drawing to show another example of relation between input power to lamp and illuminance.

In contrast, utilizing the fact that the light output of mercury lamp changes approximately in proportion to the input power, it is also possible that the input power P at start of lighting (t =0) of mercury lamp is set lower as shown by a curve 34P in FIG. 2 and then the input power P is increased so as to compensate for a decrease in illuminance E on wafer with a lapse of the lighting time t, thus maintaining the illuminance E on wafer constant as shown by a straight line 33E. According to this method, the printing time for wafer can be kept nearly constant independent of the lighting time of mercury lamp.

For example, in the cases of projection exposure apparatus, because passage of illumination light through the projection optical system could change the position of image plane (focus position), The curvature of field, the coma, etc. of projection optical system because of accumulation of heat, the upper limit $E_{max}$ of illuminance E on wafer is often set to keep the variations of such imaging characteristics within a predetermined range. Also, allowable power $P_{max}$ is generally set for the input power P of mercury lamp and therefore the input power P is normally kept at or below the allowable power $P_{max}$.

Figure 3:
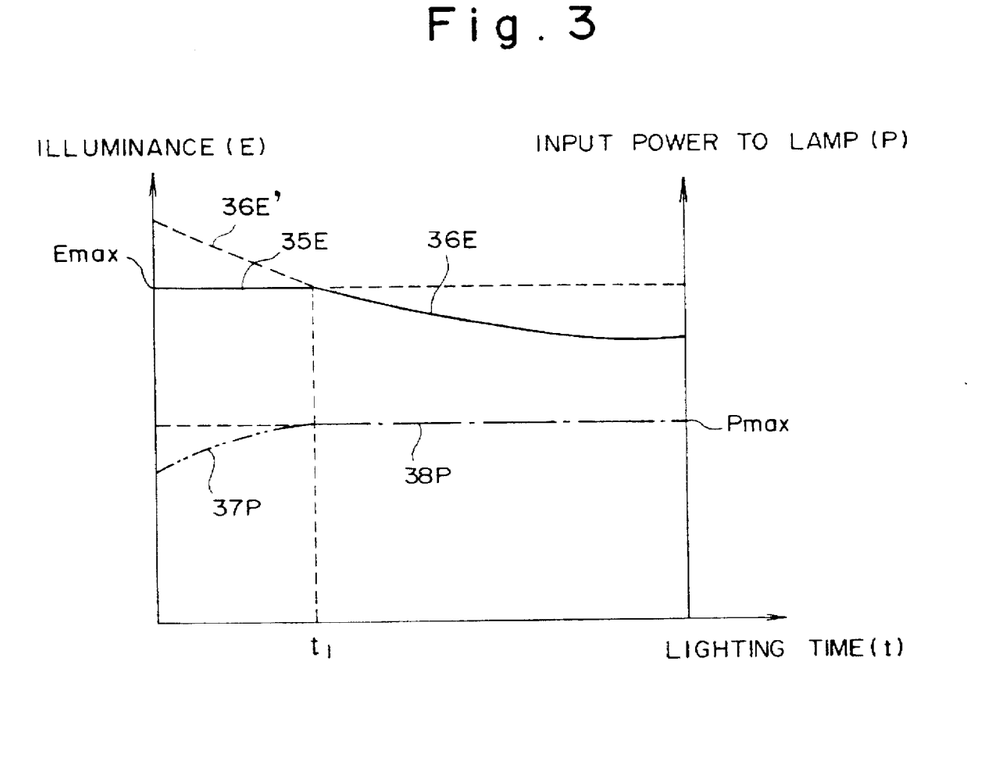
FIG. 3 is a drawing to show a conceivable relation between input power to lamp and illuminance.

FIG. 3 shows a case where the upper limit $E_{max}$ is set for the illuminance E on wafer as described, in which a straight line 35E is a straight line on which the illuminance E becomes the upper value $E_{max}$ and a straight line 38P is a straight line on which the input power P becomes the allowable power $P_{max}$. In this case, if the input power P is set at the allowable power $P_{max}$ from the beginning (t =0) of the lighting time, the illuminance E on wafer exceeds the upper limit $E_{max}$ as shown by a dashed curve 36E'. Because of it, utilizing the relation between the light output and the input power of mercury lamp as described above, the input power P to the mercury lamp is set lower than the allowable power $P_{max}$ in the initial period of lighting time as shown by a curve 37P, whereby the illuminance E is set at the upper limit $E_{max}$; and then the input power P is set at the allowable power $P_{max}$ from a point $t_1$ of intersection between the curve 37P and the straight line 38P in this method the illuminance E after the point $t_1$ gradually decreases from the upper value $E_{max}$ as shown by a curve 36E. Besides it, it is conceivable that the input power P is kept at the allowable power $P_{max}$ from the beginning of lighting time and a quantity of illumination light from the mercury lamp is equally decreased by means of an ND filter, a metal screen, or the like.

A recent progress in optical designing is now bringing into practical use the so-called modified light source method (for example, as disclosed in Japanese Laid-open Patent Application No. 4-225358) in which the shape of the σ stop in illumination optical system is differently modified to improve the resolution of projected image and the depth of focus, and the so-called phase shift mask method (as disclosed in Japanese Patent Publication No. 62-50811) in which a reticle with a phase shifter added thereto is used to improve the resolution of projected image, etc. In the cases where the modified light source method, the phase shift mask method, etc. are used while changing over one to another, the illumination optical system needs to have a plurality of a stops having different aperture shapes therein.

However, in the case of a plurality of σ stops being provided as described, values of illuminance on wafer in using the respective σ stops are not originally equal to each other. Because of it, even though the input power to the mercury lamp in using a certain specific σ stop is adjusted in such a property that the illuminance E on wafer becomes constant in accordance with the control method for example as shown in FIG. 2, the illuminance E on wafer changes upon changeover of the stop into another σ stop so as to need to change the printing time, thus causing the inconvenience of complicating the control. In addition to the change in illuminance on wafer, there is another inconvenience that, for example, if the input power P to the mercury lamp is set somewhat lower for a σ stop giving the highest illuminance on wafer, the illuminance on wafer in using the other σ stops is so lowered as to necessitate longer exposure time, thus decreasing the throughput.

Figure 4:
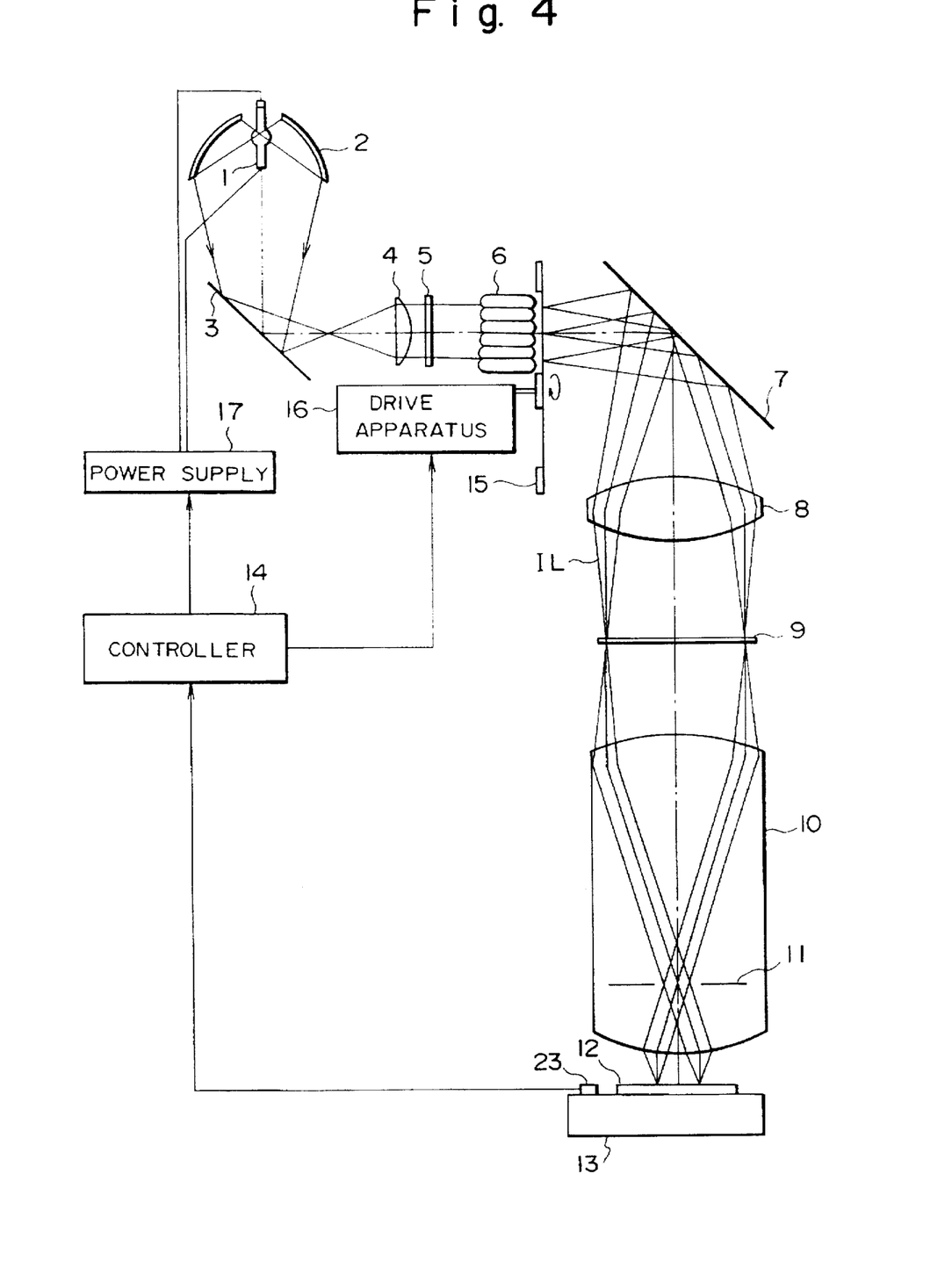
FIG. 4 is a schematic structural drawing to show a projection exposure apparatus to which an embodiment of the illumination optical apparatus according to the present invention is applied.

FIG. 4 shows the schematic structure of the projection exposure apparatus in the present embodiment. In FIG. 4, beams emitted from a short arc mercury lamp 1 are collected by an ellipsoidal mirror 2 and then reflected by a mirror 3, and thereafter is changed into nearly parallel beams by a collector lens 4 to enter a wavelength selecting filter 5.

Flux of light having passed through the wavelength selecting filter 5, which is flux of light in a predetermined wavelength region selected to match with the achromatic range of a reduction projection optical system 10, is then incident into a multi-beam generating optical element 6 consisting of a fly's eye lens (hereinafter referred to as "fly's eye integrator"). The entrance plane (front focal plane) of the fly's eye integrator 6 is arranged as conjugate with a pattern-formed surface of a reticle 9 by a condenser lens 8, and is also arranged as conjugate with an exposure surface of wafer 12 by the reduction projection optical system 10.

Also, a variable illumination-system aperture stop (hereinafter referred to as "variable σ stop") 15 for setting the illumination conditions is provided on exit plane of the fly's eye integrator 6. A substantial surface illuminant consisting of a lot of secondary light source images formed by the fly's eye integrator 6 is formed on the plane where the variable σ stop 15 is set. Illumination light IL through the aperture in the variable σ stop 15 advances via a mirror 7 and the condenser lens 8 then to illuminate a pattern area on the pattern-formed surface of reticle 9 with uniform illuminance and on a sumerimposed manner. Under the illumination light IL an image of the pattern on reticle 9 is projected through the reduction projection optical system 10 onto each shot area on the wafer 12 coated with a photoresist.

On this occasion, an image of The surface illuminant in the aperture of the variable σ stop 15 is formed on the entrance pupil plane 11 of reduction projection optical system 10, thus realizing the so-called Köhler illumination. The wafer 12 is held on a wafer stage 13, which positions the wafer 12 in the direction of the optical axis of reduction projection optical system 10 and in two mutually orthogonal directions in a plane perpendicular to the optical axis. The operation of wafer stage 13 is under control of a controller 14 controlling the operation of the entire apparatus. Also, through a drive apparatus 16, the controller 14 sets a desired aperture in the variable σ stop 15 on the exit plane of fly's eye integrator 6, and controls the power supplied to the mercury lamp 1 from power supply 17. Further, an illuminometer sensor 23 consisting of a photoelectric conversion element is set on the wafer stage 13, and output signals from the illuminometer sensor 23 are supplied to the controller 14. Here, the drive apparatus 16 is composed of an actuator and a driver.

FIG. 5 shows the structure of the variable σ stop 15. In FIG. 5, the variable σ stop 15 is so arranged that four stops 18 to 21 different in shape from each other are provided on a rotatable disk. Specifically, the stop 18 is a large, circular aperture, the stop 19 a small, circular aperture, the stop 20 an annular aperture, and the stop 21 four small apertures deviating from the center axis. The stop 20 is used in annular illumination, and the stop 21 in illumination by the modified light source method. In other words, depending upon the resolution or the depth of focus necessary for exposure of the pattern on reticle 9, a suitable stop is selected out of the stops 18 to 21. The drive apparatus 16 in FIG. 4 rotates the variable σ stop 15 about the rotational axis 15a in FIG. 5 to set a selected stop on the exit plane of the fly's eye integrator 6.

Figure 6:
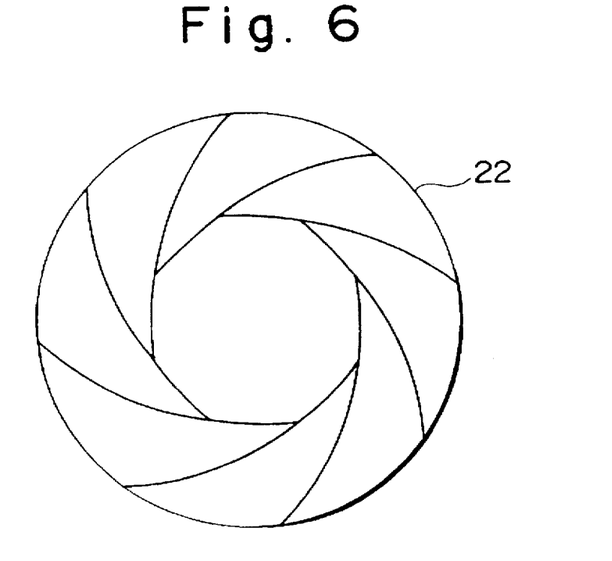
FIG. 6 is an enlarged drawing to show another example of the variable σ stop 15 in FIG. 4.

An iris stop 22 as shown in FIG. 6 may be used as the variable σ stop 15 in FIG. 4. Using such an iris stop 22, the σ value as the coherency factor of illumination light, which is a ratio between the exit-side numerical aperture of illumination optical system and the entrance-side numerical aperture of projection optical system 10, can be continuously changed within a certain range.

Returning to FIG. 4, the present embodiment is so arranged that a suitable stop (either one of the stops 18 to 21 in FIG. 5) in The variable σ stop 15 is selected in accordance with the resolution or the depth of focus necessary for exposure of the pattern on reticle 9 to be see on the exit plane of fly's eye integrator 6 and that the input power from the power supply 17 to the shorn arc mercury lamp 1 is controlled at a predetermined value, thereby performing efficient illuminance control suitable for the selected stop. This arrangement raises expectations of an improvement in throughput of exposure process.

Next described is an example of the method for controlling the illuminance on wafer 12. Since the reticle 9 is conjugate with the wafer 12, the illuminance on wafer 12 is in proportion to the illuminance on reticle 9. It is thus also accepted that the illuminants on reticle 9 is controlled in a predetermined state. First, because a change amount of light output from the mercury lamp 1 is nearly proportional to a change amount of input power and a proportional constant thereof is constant regardless of the lighting time (integral value of lighting time of lamp), the proportional constant between the input power and the illuminance is preliminarily determined by measuring the illuminance, for example, by the illuminometer sensor 23 set in the exposure field of reduction protection optical system 10 while changing the input power from the power supply 17 to the mercury lamp 1.

Next, the illumination conditions are determined based on the resolution of pattern on reticle 9 and the depth of focus needed by the process, and in response thereto a used stop is selected in the variable σ stop 15. Then, before the reticle 9 or the wafer 12 is loaded, the illuminance E on the exposure field of reduction projection optical system 10 is measured by the illuminometer sensor 23. In this case, in order to keep variations of imaging properties due to thermal deformation of reduction projection optical system 10 within a predetermined allowable range, the upper limit $E_{max}$ is determined for the illuminance E on the exposure field, i.e., for the illuminance E on the wafer 12. Also, predetermined allowable power $P_{max}$ is determined for the input power P to the mercury lamp 1. Normally, the input power P should be preferably used at or below the allowable power $P_{max}$.

Figure 7:
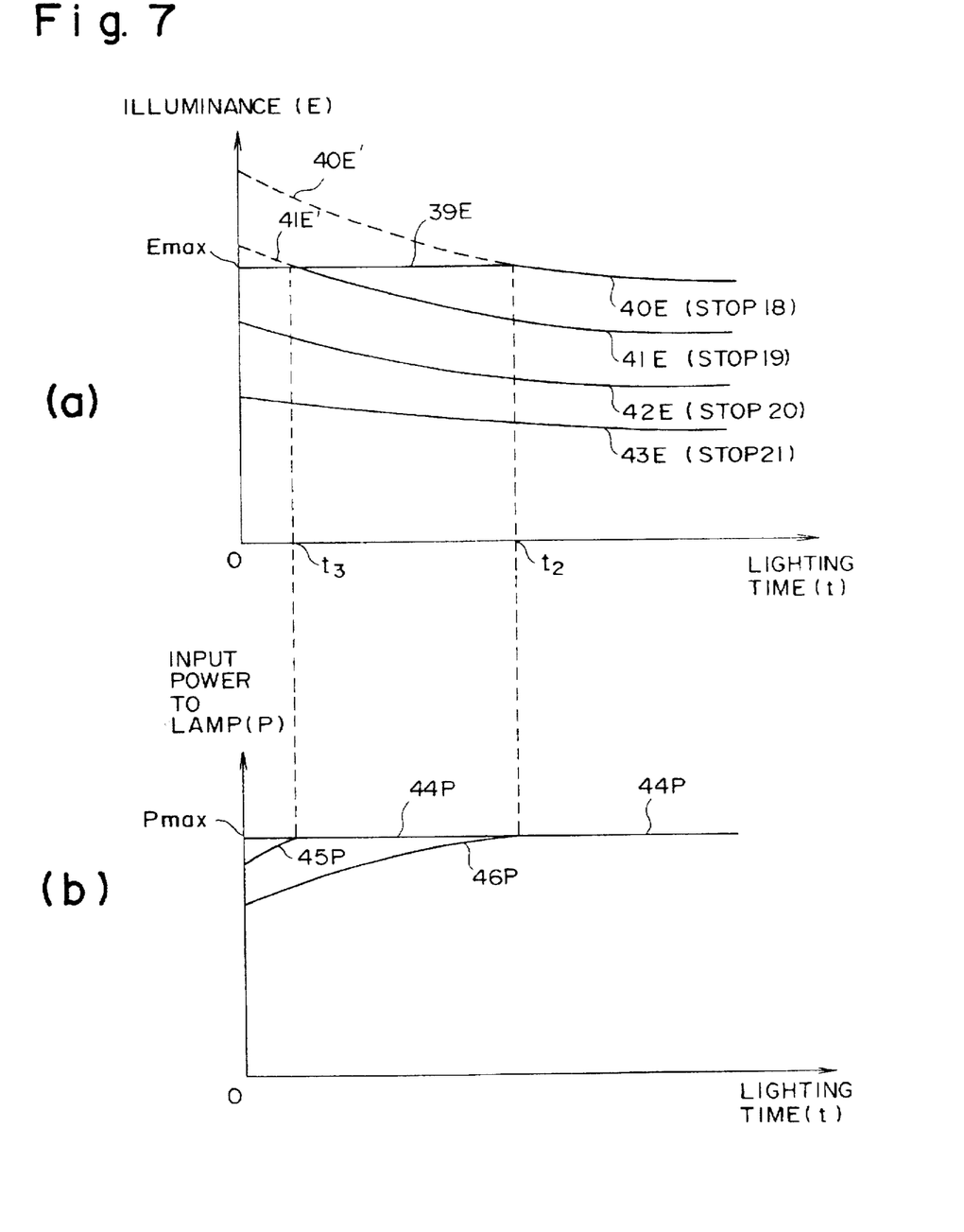
FIG. 7(a) and 7(b) are drawings to show an example of a method for controlling the input power to a mercury lamp in accordance with the lighting time of mercury lamp, and the illuminance on a wafer in that case.

Accordingly, as shown in (b) of FIG. 7, first setting the input power P to the mercury lamp 1 at the allowable power $P_{max}$ as indicated by a straight line 44P, each of the stops 18 to 21 in FIG. 5 is set on the exit plane of fly's eye integrator 6 to measure the illuminance E on the exposure field. In this case, the illuminance E in using the respective stops 18 to 21 shows initial values on a dashed curve 40E', a dashed curve 41E', a solid curve 42E, and a solid curve 43E, respectively, in (a) of FIG. 7. As seen from (a) of FIG. 7, the measured illuminance E exceed the preset upper limit $E_{max}$ in using the stop 18 and the stop 19.

Then, when the stop 18 is used, the controller 14 lowers the input power P to the mercury lamp 1 below the allowable power $P_{max}$ in accordance with a curve 46P in (b) of FIG. 7 through the power supply 17 up to a point $t_2$ before which the curve 40E' is greater than the upper limit $E_{max}$. The curve 46P is so determined that the illuminance E at the point $t_2$ becomes the upper limit $E_{max}$. After the lighting time t reaches the point $t_2$, the input power P is kept at the allowable power $P_{max}$ along the straight line 44P. As so arranged, after the point $t_3$ the illuminants E changes to gradually decrease with a lapse of the lighting time t in accordance with the solid curve 40E.

Similarly, when the stop 19 is used, the input power P to the mercury lamp is lowered below the allowable power $P_{max}$ in accordance with a curve 45P in (b) of FIG. 7 up to a point $t_3$ before which the curve 41E' is greater than the upper limit $E_{max}$, so as to maintain the illuminance E at the upper limit $E_{max}$. After the lighting time t reaches the point $t_3$, the input power P is kept at the allowable power $P_{max}$ along the straight line 44P. As so arranged, after the point $t_1$ the illuminance E changes to gradually decrease with a lapse of the lighting time t in accordance with the solid curve 41E. Further, when the stop 20 or stop 21 is used, the input power P is set at the allowable power $P_{max}$ from the beginning, because the illuminance E is lower than the upper limit $E_{max}$ from the beginning with the input power P to the mercury lamp 1 being set at the allowable power $P_{max}$.

For actual control of the input power P to the mercury lamp 1, an amount of attenuation of illuminance E is monitored through the illuminometer sensor 23, for example, every lapse of a constant time as to the lighting time t to the mercury lamp 1, and the input power P is set in accordance with the amount of attenuation. As described, the control method of FIG. 7 can keep the input power P to the mercury lamp 1 at or below the allowable power $P_{max}$ and can set the illuminance E on wafer 12 to be maximum within a range not exceeding the upper limit $E_{max}$ where the each stop 18 to 21 in the variable σ stop 15 is used. Accordingly, the exposure time becomes shortest and the throughput of exposure process becomes maximum.

Figure 8:
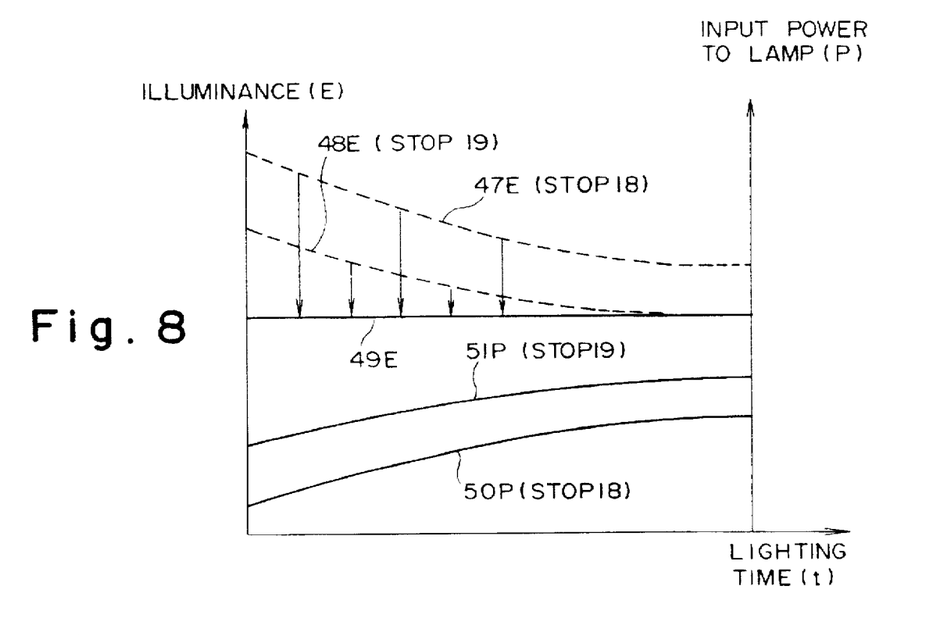
FIG. 8 is a drawing to show another example of the method for controlling the input power to the mercury lamp in accordance with the lighting time of mercury lamp, and the illuminance on the wafer in that case.

In another control method, as shown in FIG. 8, the illuminance E may be set constant in common where a plurality of specific stops in the variable σ stop 15 are used. Namely, in FIG. 8, if the input power P to the mercury lamp 1 were set at a constant value near the allowable power $P_{max}$ using the stop 18 or stop 19, the illuminance E on wafer changes in a different state as shown by a dashed curve 47E or a dashed curve 48E, respectively. Then this control method is so arranged that the illuminance E on wafer with the stop 18 is made coincident with that with the stop 19 as represented by a straight line 49E, which is kept constant independent of the lighting time t. The straight line 49E is set to be lower than either of the curve 47E and curve 48E.

Actually, in order to keep the illuminance E on wafer at the common straight line 49E in using the stop 18 or stop 19, the input power P supplied to the mercury lamp 1 in the use of the stop 18 or stop 19 should be gradually increased with a lapse of the lighting time t as shown by a curve 50P or 51P, respectively. Here, the straight line 49E indicating the illuminance is so determined as to keep the input power P at or below the allowable power $P_{max}$. According to this control method, the illuminance E on wafer is constant in the use of the stop 18 or stop 19, and because the illuminance E is constant independent of the lighting time t of mercury lamp 1, the printing time (exposure time) of the pattern of reticle 9 is common to the stops and always constant. Accordingly, the exposure control can be facilitated.

Figure 9:
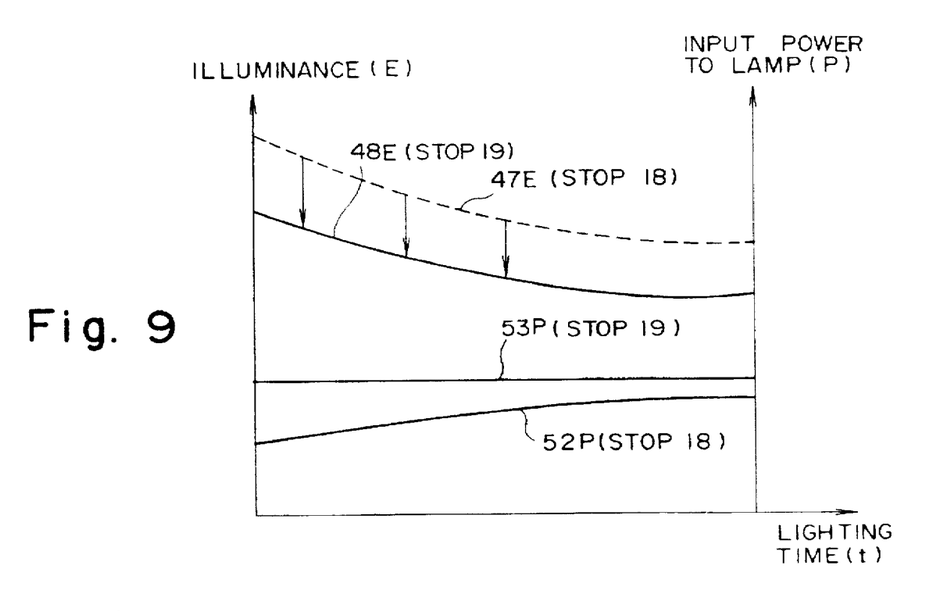
FIG. 9 is a drawing to show another example of the method for controlling the input power to the mercury lamp in accordance with the lighting time of mercury lamp, and the illuminance on the wafer in that case.

In another method, where a plurality of specific stops in the variable σ stop 15 in FIG. 4 are used, the illuminance on wafer may be arranged to match with a lower illuminance, as shown in FIG. 9. Namely, as shown by a straight line 53P in FIG. 9, the input power P to the mercury lamp 1 is set at a constant value near the allowable power $P_{max}$ and with the stop 18 or stop 19, the illuminance E on wafer changes in a different state as shown by a dashed curve 47E or a solid curve 48E, respectively. Namely, the illuminants E with the stop 19 is always lower than that with the stop 18.

Thus, this control method is so arranged that in using the stop 19, the input power P to the mercury lamp 1 is set at a constant value near the allowable power $P_{max}$ in accordance with the straight line 53P. Also, in using the stop 18, the input power P is controlled so that the illuminants E becomes equal to values indicated by the curve 48E with the stop 19. Specifically, in using tale stop 18, the input power P is adjusted in the range lower than the straight line 53P, as shown by a curve 52P. According to this control method, the illuminance E on wafer with the stop 18 is equal to that with stop 19, thus making the exposure control in common. Comparing this method with the control method of FIG. 8, the printing time must be gradually increased, because the illuminance E gradually decreases with a lapse of the lighting time t of mercury lamp 1. On the other hand, because the illuminance E is greater than that in the case of FIG. 8, the printing time can be reduced, thus improving the throughput of exposure process.

The above-described embodiment used the illuminometer sensor 23 set on the wafer stage 13 as a sensor for measuring the illuminants E on the wafer 12. It should be, however, noted that the setting position of the sensor for measuring the illuminance E is not limited to on the wafer stage 13.

Figure 10:
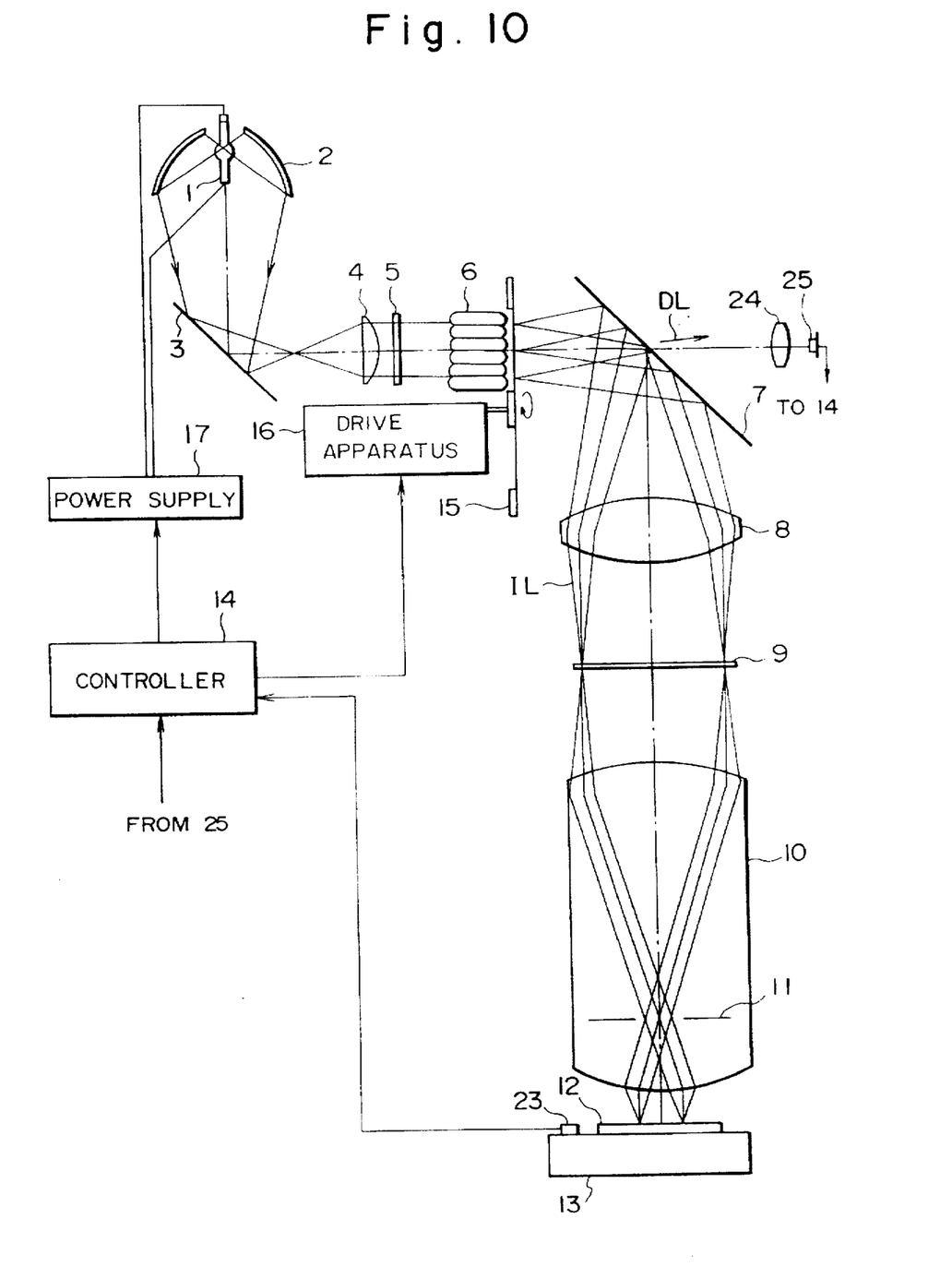
FIG. 10 is a schematic structural drawing to show an example in which a second illuminometer sensor is set behind a mirror 7 in the projection exposure apparatus of FIG. 4.

FIG. 10 shows a projection exposure apparatus in which another illuminometer sensor is located also at another position. In FIG. 10, provided in order behind the mirror 7 for bending the optical path of illumination light IL are a condenser lens 24 and a second illuminometer sensor 25 consisting of a photoelectric conversion element. In this case, leaking light DL having passed through the mirror 7 out of the illumination light IL incident into the mirror 7 is condensed on a light-receiving surface of the second illuminometer sensor 25 by the condenser lens 24, and output signals from the second illuminometer sensor 25 are supplied to the controller 14. It is also conceivable that the mirror 7 is replaced by a beam splitter having a certain small transmittance and that illumination light having passed through the beam splitter is guided into the second illuminometer sensor 25.

The light-receiving surface of the second illuminometer sensor 25 is set on the Fourier transform plane of the setting plane of the variable σ stop 15 by the condenser lens 24. Namely, the pattern-formed surface of reticle 9 is substantially conjugate with the light-receiving surface of illuminometer sensor 25, so that the illuminometer sensor 25 can measure the illuminance on the setting plane of reticle 9. Using the illuminometer sensor 25 behind the mirror 7 as described, the illuminance on reticle 9, in turn, the illuminants on wafer 12 can be monitored during exposure of an image of pattern of reticle 9 on the wafer 12 through the reduction projection optical system 10. Accordingly, the exposure process does not have to be interrupted by the measurement of illuminance, which can further improve the overall throughput of exposure process and can increase frequency of measurement of illuminance so as to enhance the control accuracy of illuminance.

In another arrangement, a beam splitter having a certain small reflectivity is set between the fly's eye integrator 6 and the condenser lens 8 to monitor reflected light by the beam splitter in FIG. 10, thereby monitoring the illuminance on reticle 9, in turn, the illuminance on the wafer 12.

The above embodiments used the reduction projection optical system 10, but the present invention can also be applied similarly to exposure apparatus, for example, of the proximity type not using the projection optical system. Further, the above embodiments employed the mercury lamp as a light source, but the present invention can also be applied to cases employing a laser light source, for example, such as an excimer laser light source as a light source as long as it has such a property that with constant input power to the laser light source, output energy thereof gradually decreases with time.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 5-321190 filed on Dec. 27, 1993 is hereby incorporated by reference.

What is claimed is:

1. An illumination optical apparatus comprising:
 a light source device for emitting illumination light;
 an illumination optical system arranged at a position where the light emerging from said light source device can be received, for illuminating an illuminated object at a nearly uniform illuminance with illumination light emerging from said light source device, said illumination optical system including a multi light source forming unit, arranged in said illumination optical system, for forming a plurality of light sources based on the light emerging from said light source device;
 an illumination state changing unit, arranged in said illumination optical system, for changing a size or shape of said plurality of light sources formed by said multi light source forming unit; and
 a power controlling unit, electrically connected with said light source device for controlling power supplied to said light source device according to the size or shape of said plurality of light sources change by said illumination state changing unit.

2. An illumination optical apparatus according to claim 1, wherein said light source device includes a mercury lamp which decreases light output thereof to the input power with a lapse of lighting time.

3. An illumination optical apparatus according to claim 1, wherein said illumination optical system comprises:
 a parallel beam forming unit, arranged at a position where the light emerging from said light source device can be received, for converting the light from said light source device into light having nearly parallel beams and for guiding the light to said multi light source forming unit;
 a condenser system, arranged at a position where the light from said multi light source forming unit can be received, for illuminating said illuminated object in a superimposed manner with the light from said multi light source forming unit,
 wherein said multi light source forming unit comprises a multi-beam generating optical element, arranged at a position where the light emerging from said parallel beam forming unit can be received, for forming a plurality of light source images, based on the light from said parallel beam forming unit.

4. An illumination optical apparatus according to claim 3, wherein said multi-beam generating optical element includes a fly's eye integrator.

5. An illumination optical apparatus according to claim 1, wherein said illumination state changing unit is an aperture stop changeover unit for changing over a plurality of aperture stops for limiting said illumination light on a Fourier transform plane for said illumination object.

6. An illumination optical apparatus according to claim 5, wherein maid aperture stop changeover unit comprises:
 a plate in which a plurality of said aperture stops are provided; and
 a rotating device for changing over said aperture stops by rotating said plate.

7. An illumination optical apparatus according to claim 5, wherein at least one of said aperture stops comprise a circular aperture stop.

8. An illumination optical apparatus according to claim 5, wherein at least one of said aperture stops comprises an annular aperture stop.

9. An illumination optical apparatus according to claim 5, wherein at least one of said aperture stops comprise an aperture stop having a plurality of apertures deviating from the center.

10. An illumination optical apparatus according to claim 5, wherein said power controlling unit controls the power supplied to said light source device so that in using one of said plurality of aperture stops, the illuminants of said illumination light on said illuminated object does not exceed a predetermined upper limit.

11. An illumination optical apparatus according to claim 5, wherein said power controlling unit controls the power supplied to said light source device so that in using one of said plurality of aperture stops, the illuminants of said illumination light on said illuminated object is constant.

12. An illumination optical apparatus according to claim 5, wherein said power controlling unit controls the power supplied to said light source device so that, letting a first aperture stop be an aperture stop which makes the luminance on said illuminated object lowest with the light output of said light source device being constant and a second aperture stop be an aperture stop other than said first aperture stop, an illuminance on said illuminated object in using said second aperture stop becomes coincident with an illuminance on said illuminated object in using said first aperture stop.

13. An illumination optical apparatus according to claim 1, wherein said illumination state changing unit includes an iris stop for continuously changing a σ value which is a coherency factor of the illumination light.

14. An illumination optical apparatus according to claim 1, wherein said power controlling unit controls the power supplied to said light source device at or below allowable input power to said light source device.

15. An exposure apparatus comprising:

a light source device for emitting illumination light;

a multi light source forming unit, arranged at a position where light emerging from said light source device can be received, for forming a plurality of light sources based on the light emerging from said light source device;

a condenser system, arranged at a position where the light from said multi light source forming unit can be received, for illuminating an illuminated object in a superimposed manner with the light from said multi light source forming unit;

an illumination state changing unit, arranged in connection with said multi light source forming unit, for changing a size or shape of said plurality of light sources formed by said multi light source forming unit;

a power controlling unit, electrically connected with said light source device, for controlling power supplied to said light source device according to the size or shape of said plurality of light sources changed by said illumination state changing unit;

a reticle stage for holding a reticle as said illuminated object;

a substrate stage for holding a photosensitive substrate coated with a photoresist; and a projection optical system for projecting a pattern of said reticle onto said photosensitive substrate.

16. An exposure apparatus according to claim 15, wherein an illuminometer for detecting an illuminance of said substrate coated with a photoresist is set on said substrate stage and, based on an output from said illuminometer, said power controlling unit controls the power supplied to said light source device.

17. An exposure apparatus according to claim 16, wherein said illuminometer has a photoelectric conversion element.

18. An exposure apparatus according to claim 15, which comprises a reflective mirror for reflecting light from said multi light source forming unit to let the light enter said condenser system; and an illuminometer for receiving light passing through said reflective mirror;

wherein, based on an output from said illuminometer, said power controlling unit controls the power supplied to said light source device.

19. An exposure apparatus according to claim 18, wherein said illuminometer has a photoelectric conversion element.

20. An exposure apparatus according to claim 15, wherein said multi light source forming unit includes an optical integrator.

21. A method for fabricating a semiconductor device, comprising:

a step of illuminating a reticle as said illuminated object by using an illumination optical apparatus according to claim 1; and a step of projecting a pattern on the reticle onto a substrate coated with a photoresist through a projection optical system to exposure the substrate.

22. A method for fabricating a semiconductor device, comprising:

a step of illuminating a reticle as said illuminated object by using an illumination optical apparatus according to claim 3; and a step of projecting a pattern on the reticle onto a substrate coated with a photoresist through a projection optical system to exposure the substrate.

23. A method for fabricating a semiconductor device, comprising:

a step of illuminating a reticle as said illuminated object by using an illumination optical apparatus according to claim 14; and a step of projecting a pattern on the reticle onto a substrate coated with a photoresist through a projection optical system to exposure the substrate.

24. A method for fabricating a semiconductor device, comprising:

a step of illuminating a reticle as said illuminated object by using an illumination optical apparatus according to claim 10; and a step of projecting a pattern on the reticle onto a substrate coated with a photoresist through a projection optical system to exposure the substrate.

25. A method for fabricating a semiconductor device, comprising:

a step of illuminating a reticle as said illuminated object by using an illumination optical apparatus according to claim 11; and a step of projecting a pattern on the reticle onto a substrate coated with a photoresist through a projection optical system to exposure the substrate.

26. A method for fabricating a semiconductor device, comprising:

a step of illuminating a reticle as said illuminated object by using an illumination optical apparatus according to claim 12; and a step of projecting a pattern on the reticle onto a substrate coated with a photoresist through a projection optical system to exposure the substrate.

* * * * *